United States Patent
Chen et al.

(10) Patent No.: US 11,051,106 B2
(45) Date of Patent: Jun. 29, 2021

(54) MOVABLE EMBEDDED MICROSTRUCTURE

(71) Applicant: Fortemedia, Inc., Santa Clara, CA (US)

(72) Inventors: Li-Jen Chen, Hsinchu (TW); Yu-Min Fu, Hsinchu (TW); Yu-Ting Cheng, Hsinchu (TW); Shih-Chin Gong, Taipei (TW)

(73) Assignee: FORTEMEDIA, INC., Santa Clara, CA (US)

( * ) Notice: Subject to any disclaimer, the term of this patent is extended or adjusted under 35 U.S.C. 154(b) by 303 days.

(21) Appl. No.: 16/396,978

(22) Filed: Apr. 29, 2019

(65) Prior Publication Data

US 2020/0344551 A1   Oct. 29, 2020

(51) Int. Cl.
| | |
|---|---|
| H04R 1/00 | (2006.01) |
| H04R 7/02 | (2006.01) |
| H05K 1/18 | (2006.01) |
| H04R 9/02 | (2006.01) |
| H01F 27/28 | (2006.01) |

(52) U.S. Cl.
CPC .......... *H04R 7/02* (2013.01); *H01F 27/2804* (2013.01); *H04R 9/025* (2013.01); *H05K 1/181* (2013.01); *H01F 2027/2809* (2013.01); *H05K 2201/10083* (2013.01)

(58) Field of Classification Search
CPC .......... H04R 7/02; H04R 9/025; H04R 9/047; H04R 2201/003; H04R 9/06; H04R 9/02; H04R 2400/11; H05K 1/181; H05K 2201/10083; H05K 3/188; H05K 2201/083; H05K 2201/09245; H05K 3/064; H01F 27/2804; H01F 2027/2809; H01F 2007/068; H01F 7/0289; H01F 7/066
See application file for complete search history.

(56) References Cited

U.S. PATENT DOCUMENTS

| | | | | |
|---|---|---|---|---|
| 7,570,775 | B2 * | 8/2009 | Araki | ..................... H04R 23/00 381/174 |
| 9,327,961 | B2 | 5/2016 | Lemarquand et al. | |
| 2005/0220320 | A1 | 10/2005 | Kim et al. | |

(Continued)

FOREIGN PATENT DOCUMENTS

| | | |
|---|---|---|
| CN | 1678131 A | 10/2005 |
| CN | 102948170 A | 2/2013 |

(Continued)

OTHER PUBLICATIONS

Chinese language office action dated Apr. 8, 2021, issued in application No. CN 201910535281.3.

(Continued)

*Primary Examiner* — Matthew A Eason
(74) *Attorney, Agent, or Firm* — McClure, Qualey & Rodack, LLP

(57) ABSTRACT

A movable embedded microstructure includes a substrate, a diaphragm, a circuit board, a permanent magnetic element, and a multi-layered coil. The substrate has a hollow chamber. The diaphragm is disposed on the substrate, and covers the hollow chamber. The circuit board is bonded to the substrate. The permanent magnetic element is disposed on the circuit board and in the hollow chamber. The multi-layered coil is embedded in the diaphragm.

18 Claims, 10 Drawing Sheets

(56) References Cited

U.S. PATENT DOCUMENTS

| | | | |
|---|---|---|---|
| 2009/0316937 A1* | 12/2009 | Zheng | H04R 19/00 381/182 |
| 2010/0124352 A1* | 5/2010 | Jin | H04R 13/00 381/396 |
| 2013/0156253 A1* | 6/2013 | Lemarquand | H04R 7/18 381/396 |
| 2015/0117698 A1 | 4/2015 | Bullimore | |
| 2016/0037265 A1* | 2/2016 | Khenkin | H04R 19/04 381/174 |
| 2020/0178000 A1* | 6/2020 | Niekiel | H04R 9/00 |
| 2020/0196067 A1* | 6/2020 | Rusconi Clerici Beltrami | H04R 1/24 |

FOREIGN PATENT DOCUMENTS

| | | | |
|---|---|---|---|
| CN | 106454659 A | 2/2017 | |
| CN | 107124684 A | 9/2017 | |
| WO | WO-2015178760 A1 * | 11/2015 | H04R 31/00 |

OTHER PUBLICATIONS

English language translation of Chinese office action dated Apr. 8, 2021, issued in application No. CN 201910535281.3.

* cited by examiner

MOVABLE EMBEDDED MICROSTRUCTURE

BACKGROUND OF THE INVENTION

Field of the Invention

The invention relates to movable embedded microstructures, and in particular to a movable embedded microstructure with a multi-layered coil.

Description of the Related Art

Since electronic products are being developed to be smaller and thinner, how to scale down the size of these electronic products becomes an important topic. Micro electromechanical system (MEMS) technique is a technique for effectively scaling down the size of elements. The concept of the MEMS technique is to combine semiconductor process techniques and precision micromachining techniques, and to manufacture micro elements and micro systems with multiple functions. However, a MEMS technique for manufacturing moving-coil speakers has not yet to be developed.

BRIEF SUMMARY OF THE INVENTION

Some embodiments of the disclosure provide a movable embedded microstructure, including: a substrate, a diaphragm, a circuit board, a permanent magnetic element, and a multi-layered coil. The substrate has a hollow chamber. The diaphragm is disposed on the substrate, and covers the hollow chamber. The circuit board is bonded to the substrate. The permanent magnetic element is disposed on the circuit board and in the hollow chamber. The multi-layered coil is embedded in the diaphragm.

In some embodiments, the movable embedded microstructure further includes an insulating layer formed between the substrate and the diaphragm. The movable embedded microstructure further includes a seed layer and a soft magnetic element, wherein the seed layer is disposed between the insulating layer and the soft magnetic element. The seed layer and the soft magnetic element are embedded in the diaphragm. The soft magnetic element and the permanent magnetic element are located on different horizontal planes. The seed layer includes titanium and copper. The soft magnetic element includes nickel iron alloy.

In some embodiments, the multi-layered coil includes a first layer and a second layer, and the first layer and the second layer at least partially overlap. The movable embedded microstructure further includes a dielectric layer formed between the first layer and the second layer. The dielectric layer has a hole, and the first layer is electrically connected to the second layer through the hole. The hole of the dielectric layer and an opening of the diaphragm overlap in a vertical direction. In some embodiments, the first layer has a spiral structure disposed around a central axis of the diaphragm, and the second layer crosses the spiral structure. The first layer is electrically connected to the second layer in an opening of the diaphragm, and the first layer has an S-shaped structure connecting the spiral structure to the opening of the diaphragm. In some embodiments, the first layer includes a plurality of coaxial segments disposed around a central axis of the diaphragm, and the plurality of coaxial segments are electrically connected by the second layer. The second layer is disposed symmetrically around a central axis of the diaphragm.

In some embodiments, the multi-layered coil includes aluminum silicon alloy, aluminum, or copper. The diaphragm includes macromolecular materials, and the Young's modulus of the macromolecular materials is in a range of 1 MPa to 100 GPa. In some embodiments, a groove is formed around the diaphragm. The circuit board has an vent hole, and the vent hole allows the hollow chamber to communicate with the external environment.

Some embodiments of the disclosure provide a movable embedded microstructure, including: a substrate, a diaphragm, a circuit board, a permanent magnetic element, a multi-layered coil, and a soft magnetic element. The substrate has a hollow chamber. The diaphragm is disposed on the substrate, and covers the hollow chamber. The circuit board is bonded to the substrate. The permanent magnetic element is disposed on the circuit board and in the hollow chamber. The multi-layered coil is embedded in the diaphragm. The soft magnetic element is disposed on the substrate, and embedded in the diaphragm.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

The movable embedded microstructures of some embodiments of the present disclosure are described in the following description. However, it should be appreciated that the following detailed description of some embodiments of the disclosure provides various concepts of the present disclosure which may be performed in specific backgrounds that can vary widely. The specific embodiments disclosed are provided merely to clearly describe the usage of the present disclosure by some specific methods without limiting the scope of the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

Figure 1:
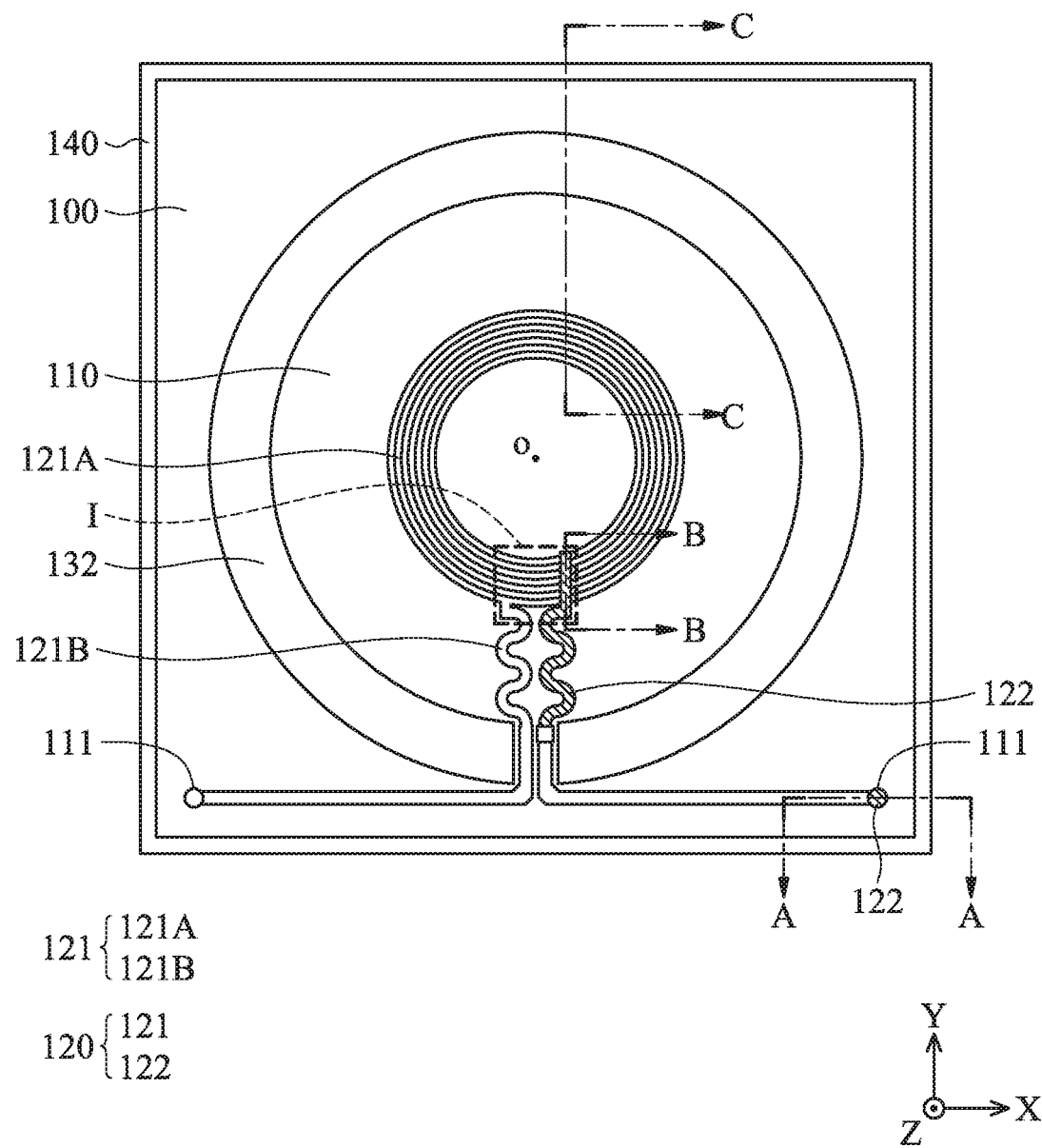
FIG. 1 is a schematic top view illustrating a movable embedded microstructure in accordance with some embodiments of the present disclosure.

Referring to FIG. 1, FIG. 1 is a schematic top view illustrating a movable embedded microstructure 10 in accordance with some embodiments of the present disclosure. For example, the movable embedded microstructure 10 is electroacoustic transducer, such as a moving coil speaker, and may be disposed in general electronic products. As shown in FIG. 1, the movable embedded microstructure 10 includes a substrate 100, a diaphragm 110, a multi-layered coil 120, and a soft magnetic element 132. For example, the substrate 100 may be made of silicon or any other suitable material. The diaphragm 110 is disposed on the substrate 100, and is movable relative to the substrate 100. It should be noted that in this embodiment the diaphragm 110 is illustrated to be transparent in order to show internal structures of the movable embedded microstructure 10.

In addition, the multi-layered coil 120 and the soft magnetic element 132 are embedded in the diaphragm 110, which means that the multi-layered coil 120 and the soft magnetic element 132 are not exposed. The multi-layered coil 120 is configured to transmit electric signals, and forces the diaphragm 110 to deform relative to the substrate 100 based on the electric signals. Two openings 111 are formed in the diaphragm 110. The multi-layered coil 120 includes a first layer 121 and a second layer 122, and the first layer 121 is electrically connected to the second layer 122 in at least one of the openings 111. The first layer 121 and the second layer 122 are located on different horizontal planes which are parallel to the X-Y plane. In the present embodiment, the second layer 122 is higher than the first layer 121. That is, the second layer 122 is located closer to the top of the diaphragm 110 than the first layer 121.

Figure 2:
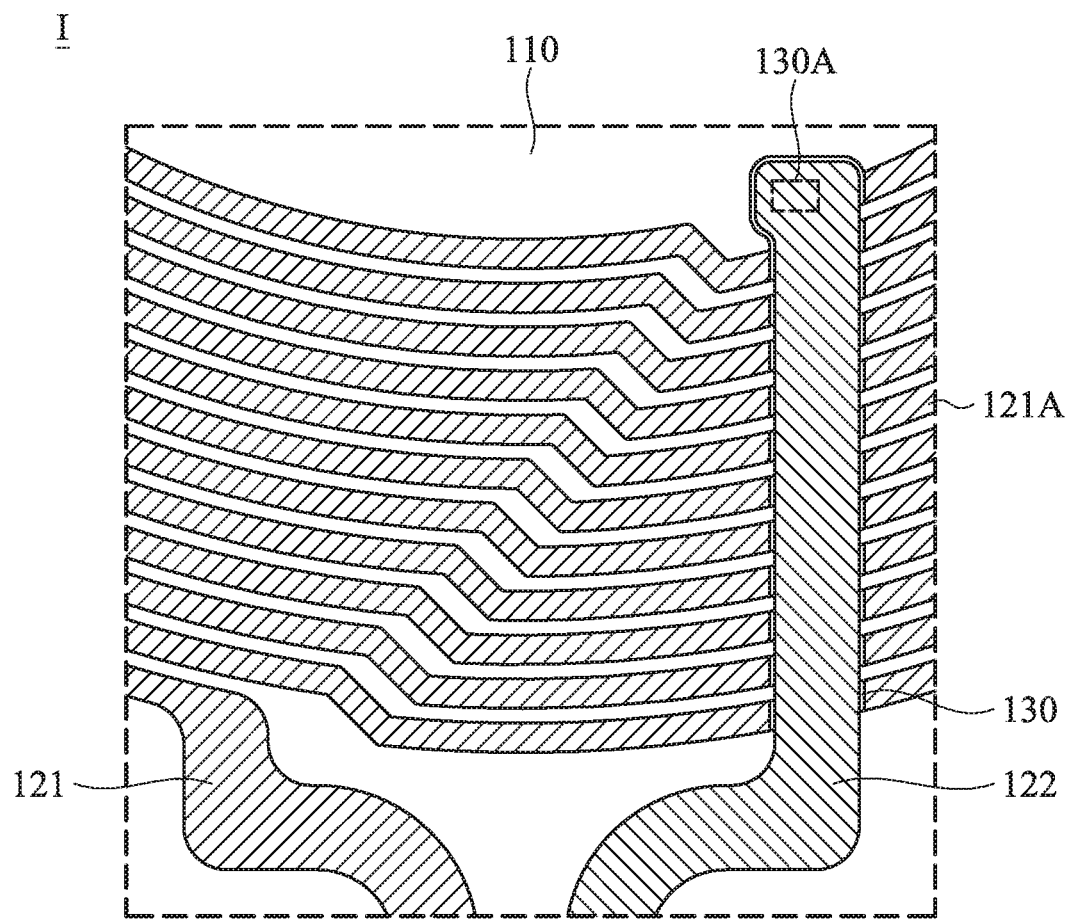
FIG. 2 is a schematic enlarged view illustrating a region I shown in FIG. 1.

It should be noted that the first layer 121 is electrically connected to the second layer 122 in at least one of the openings 111 in order to transmit electric signals from a control unit (not shown) for controlling the operation of the movable embedded microstructure 10. In the present embodiment, the first layer 121 further includes a spiral structure 121A and an S-shaped structure 121B. It should be appreciated that the multi-layered coil 120 is schematically illustrated in FIG. 1 (such as the spiral structure 121A), and the detailed structure of the multi-layered coil 120 is shown in FIG. 2. The spiral structure 121A is disposed around a central axis O of the diaphragm 110, and the S-shaped structure 121B connects the spiral structure 121A to one of the openings 111. Electrical signals transmitted in the multi-layered coil 120 may force the diaphragm 110 to deform relative to the substrate 100. By arranging the S-shaped structure 121B, the diaphragm 110 may be more flexible, and the difficulty of the oscillation may be reduced. In addition, the second layer 122 also includes an S-shaped structure.

Furthermore, a groove 140 is formed in the diaphragm 110, and the movable embedded microstructure 10 is surrounded by the groove 140. Since multiple movable embedded microstructures 10 may be formed on a wafer, the groove 140 defines the region of each of the movable embedded microstructures 10. That way, the groove 140 may help to divide those movable embedded microstructures 10 from each other using a cutting method, such as a laser.

FIG. 2 is a schematic enlarged view illustrating a region I shown in FIG. 1. As shown in FIG. 2, the second layer 122 crosses the spiral structure 121A. A dielectric layer 130 is disposed between the first layer 121 and the second layer 122 in order to prevent from generating short circuit between the first layer 121 and the second layer 122. A hole 130A is formed in the dielectric layer 130, and the first layer 121 is electrically connected to the second layer 122 through the hole 130A. The detailed structure of the movable embedded microstructure 10 will be discussed as follows in accompany with FIGS. 3A-3E.

FIGS. 3A-3E are schematic cross-sectional views illustrating manufacturing processes of the movable embedded microstructure 10 shown in FIG. 1. It should be understood that each of FIGS. 3A-3E includes cross-sectional views along lines A-A, B-B, and C-C shown in FIG. 1. That way, the manufacturing processes of different portions of the movable embedded microstructure 10 may be illustrated in a single figure. Two sets of coordinate axes are provided in FIGS. 3A-3E, wherein one set of coordinate axes in the left-hand side correspond the cross-sectional view along line A-A, and the other set of coordinate axes in the right-hand side correspond the cross-sectional views along lines B-B and C-C.

Figure 3A:
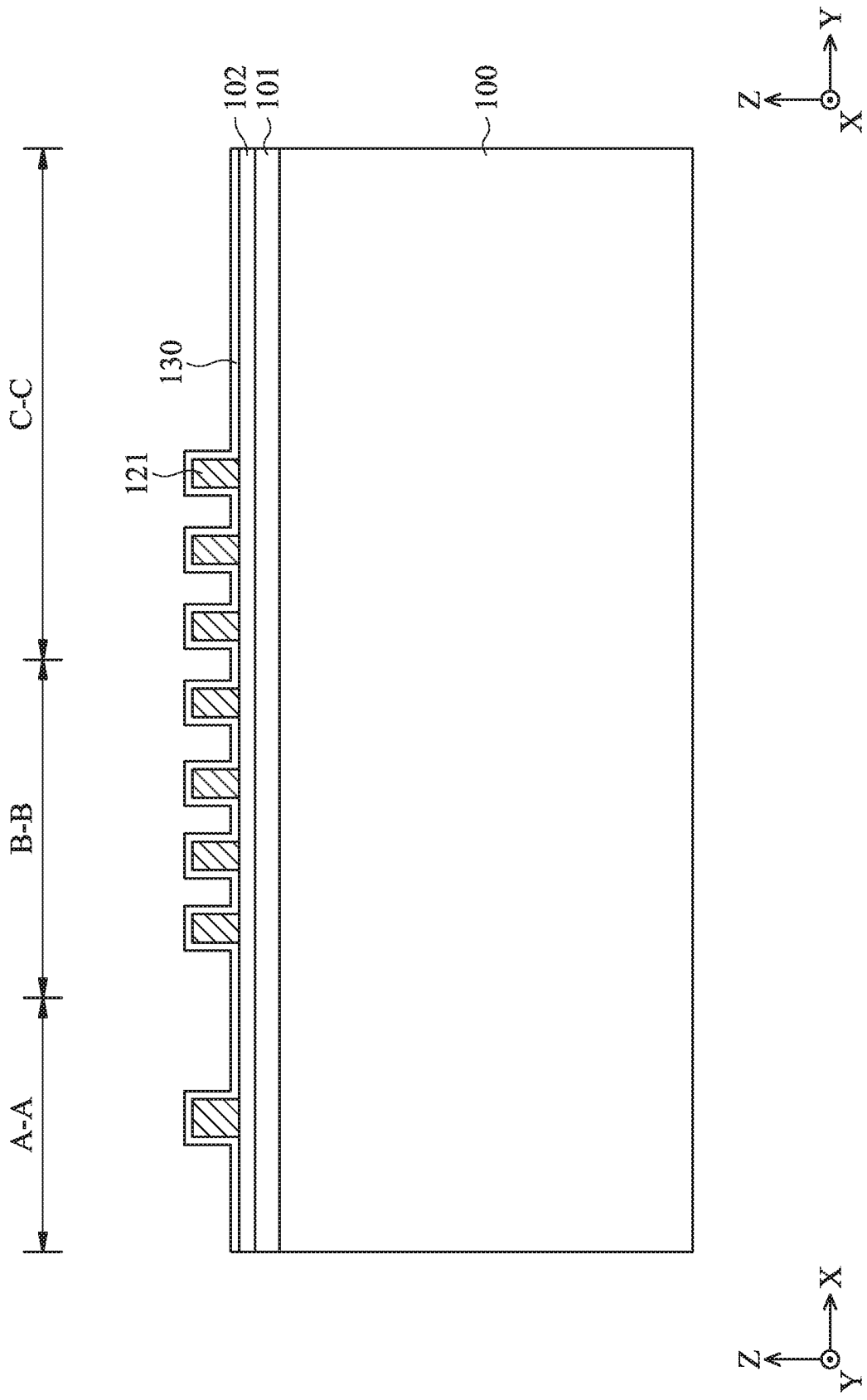
FIGS. 3A-3E are schematic cross-sectional views illustrating manufacturing processes of the movable embedded microstructure shown in FIG. 1.

As shown in FIG. 3A, the substrate 100 is provided. Two insulating layers 101, 102 are formed on the substrate 100, wherein the insulating layers 101 is disposed between the insulating layer 102 and the substrate 100. The insulating layers 101, 102 may be formed by thermal oxidation, chemical vapor deposition (CVD), plasma-enhanced chemical vapor deposition (PECVD), or any other suitable method. The first layer 121 of the multi-layered coil 120 is formed on the insulating layer 102 by physical vapor deposition (PVD), such as sputter or evaporation. Then, a photolithography process is performed to the first layer 121 for patterning the first layer 121. For example, the spiral structure 121A and the S-shaped structure 121B shown in FIG. 1 are generated. The material of the first layer 121 includes aluminum silicon alloy, aluminum, copper, or any other suitable conductive material. The dielectric layer 130 is formed on the first layer 121 and the insulating layer 102 by furnace process or chemical vapor deposition (CVD). The dielectric layer 130 may be a carbon-doped oxide or any other suitable insulating material.

Figure 3B:
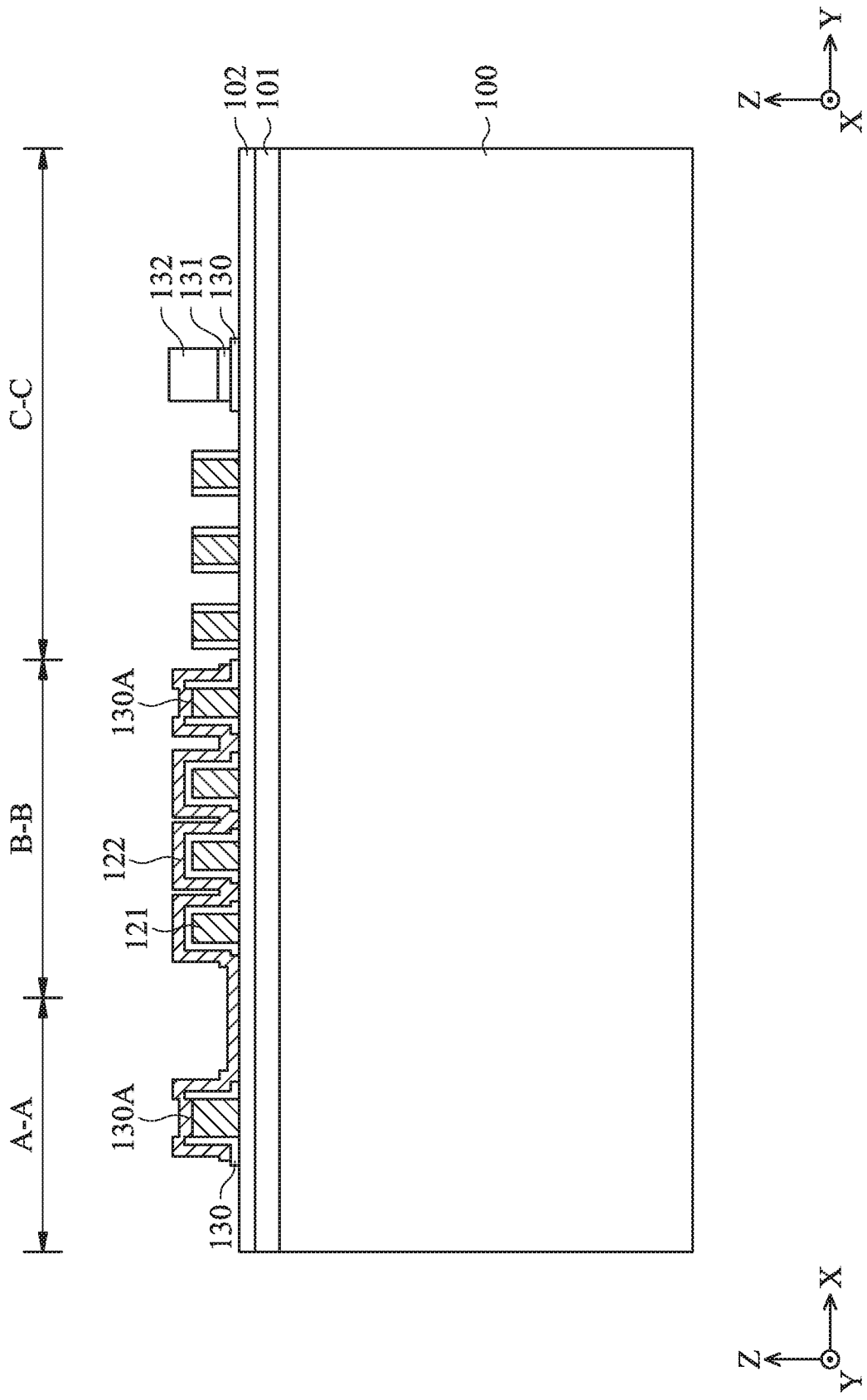

Next, as shown in FIG. 3B, a photolithography process and/or an etching process is preformed to the dielectric layer 130, and holes 130A may be formed in the dielectric layer 130, exposing the first layer 121. Then, the second layer 122 of the multi-layered coil 120 is formed on the dielectric layer 130 and the first layer 121 by physical vapor deposition (PVD), such as sputter or evaporation. Similarly, a photolithography process is performed to the second layer 122 for patterning the second layer 122, remaining the portion located on the dielectric layer 130 or in the holes 130A. The material of the second layer 122 includes aluminum silicon alloy, aluminum, copper, or any other suitable conductive material.

A seed layer 131 is formed on the dielectric layer 130 by physical vapor deposition (PVD), such as sputter or evaporation, and a photolithography process is performed to the seed layer 131 for patterning the seed layer 131. The seed layer 131 is located around the spiral structure 121A (shown in FIG. 1). The material of the seed layer 131 may include titanium (Ti) and/or copper (Cu). A soft magnetic element 132 is electro-plated on the seed layer 131. The soft magnetic element 132 may include nickel-iron alloy (NiFe) or any other suitable magnetic permeable material.

In addition, the dielectric layer 130 is cut into separated segments by a photolithography process, remaining necessary portion for insulating the first layer 121 from the subsequent second layer 122. By removing the unnecessary portion of the dielectric layer 130, the diaphragm 110 may be more flexible, and the performance of the movable embedded microstructure 10 may be enhanced.

Figure 3C:
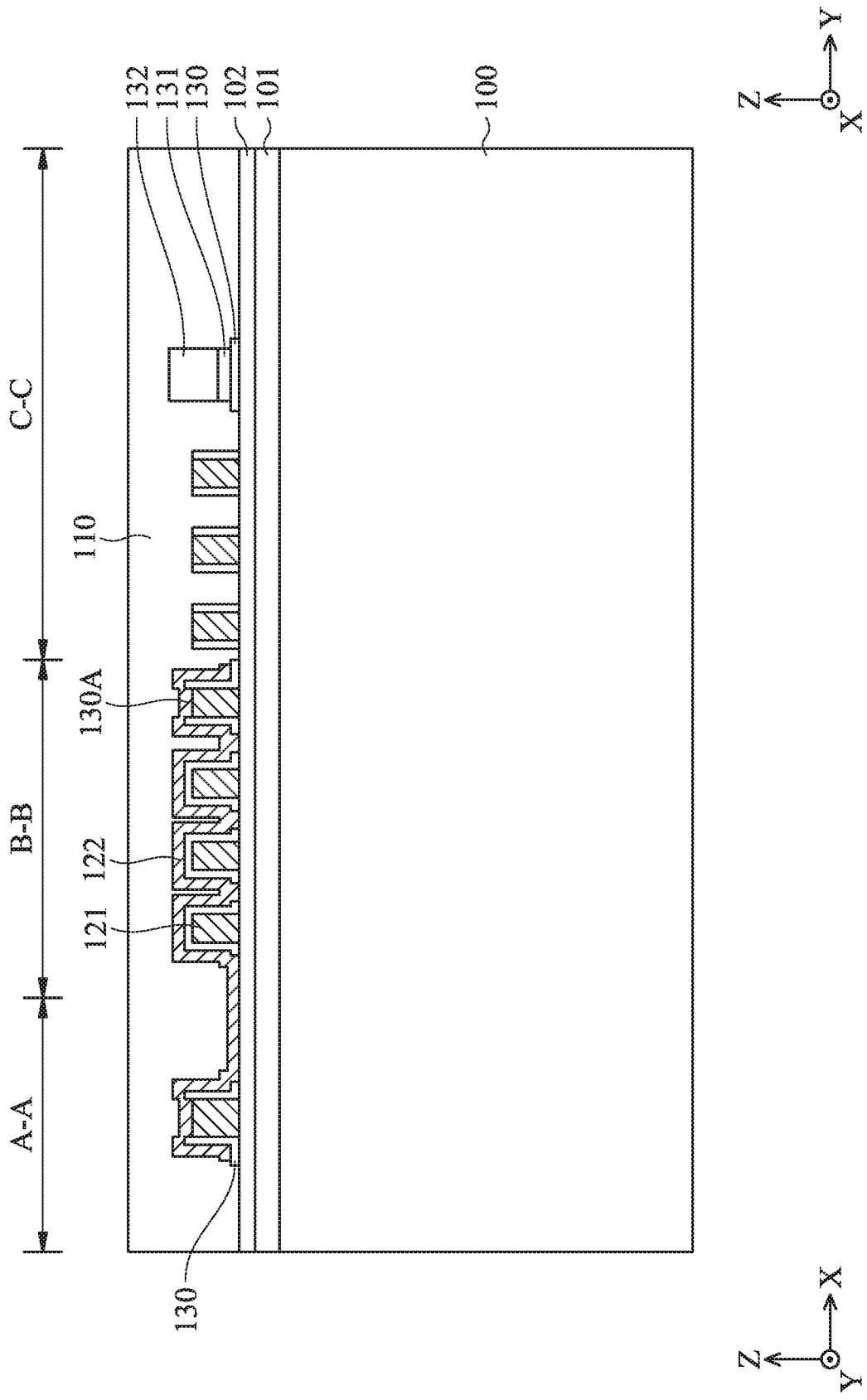

As shown in FIG. 3C, the diaphragm 110 is formed on the above-mentioned structure by spin-on coating or any other suitable method. That is, the first layer 121, the second layer 122, the dielectric layer 130, the seed layer 131, and the soft magnetic element 132 are embedded in the diaphragm 110. The material of the diaphragm 110 may be polydimethylsiloxane (PDMS), SU-8 material, or any other suitable macromolecular material. For example, the Young's modulus of the aforementioned macromolecular material is in a range of 1 MPa to 100000 MPa. In some embodiments, the Young's modulus of the diaphragm 110 is smaller than the Young's modulus of polyimide (PI).

Figure 3D:
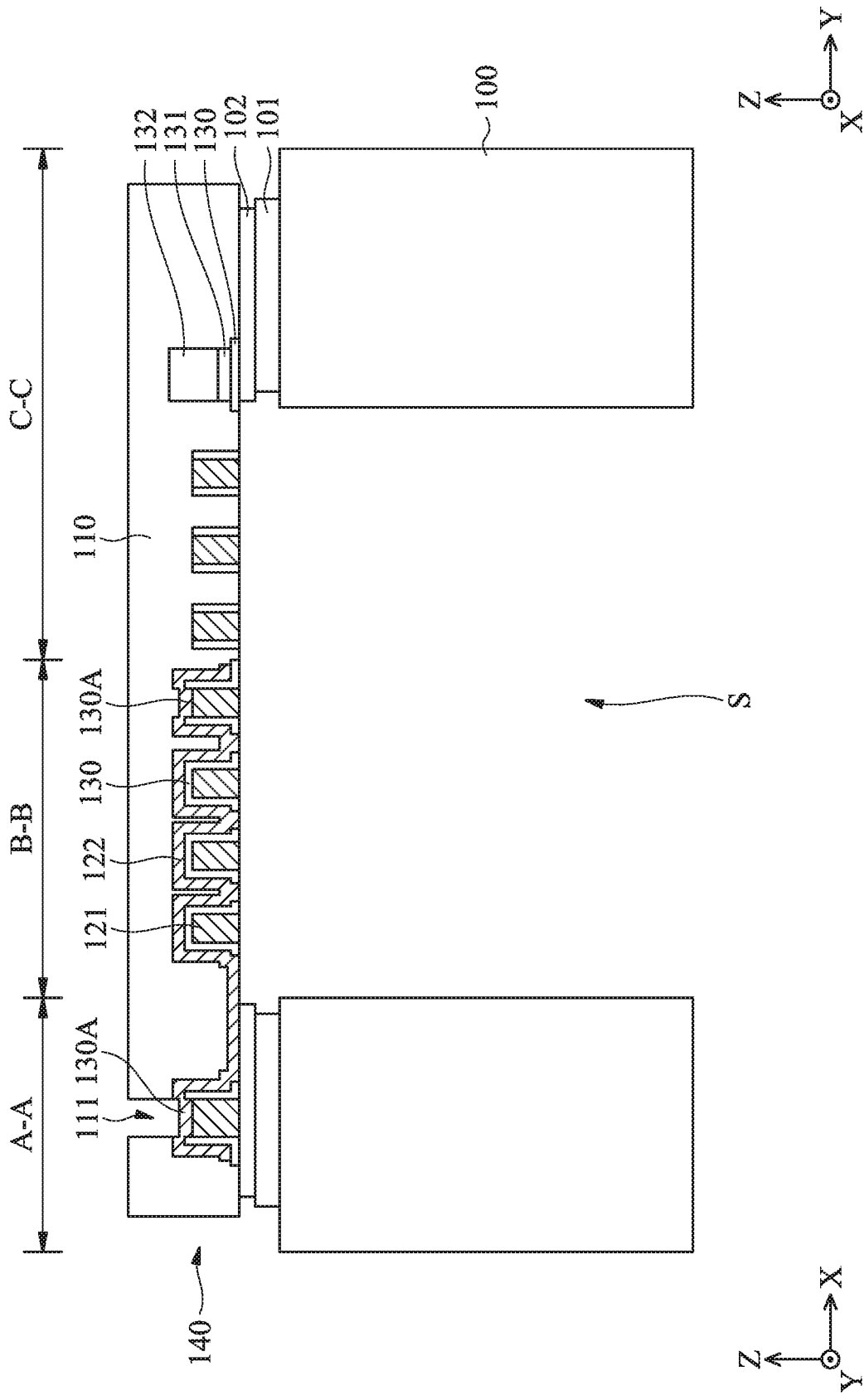

As shown in FIG. 3D, a photolithography process is performed to the diaphragm 110. Accordingly, the opening 111 is formed in the diaphragm 110, and the groove 140 is formed around the diaphragm 110. The opening 111 may expose the second layer 122. The first layer 121 is electrically connected to the second layer 122 in the opening 111. In other words, as viewed in a vertical direction (Z-axis), the opening 111 of the diaphragm 110 and one of the holes 130A may overlap. In addition, a deep reactive-ion etching process or an etching process with an etchant is performed to the substrate 100, forming a hollow chamber S in the substrate 100. The diaphragm 110 covers the hollow chamber S. It should be noted that the insulating layers 101 and 102 may serve as an etch stop layer. Therefore, the diaphragm 110 and the multi-layered coil 120 are protected from being etched. Due to the difference of the etching degrees between the insulating layers 101 and 102, the etched insulating layers 101 and 102 may not completely overlap as viewed along Z-axis. For example, a recess may be formed on one side, facing the hollow chamber S, of the insulating layer 101.

Figure 3E:
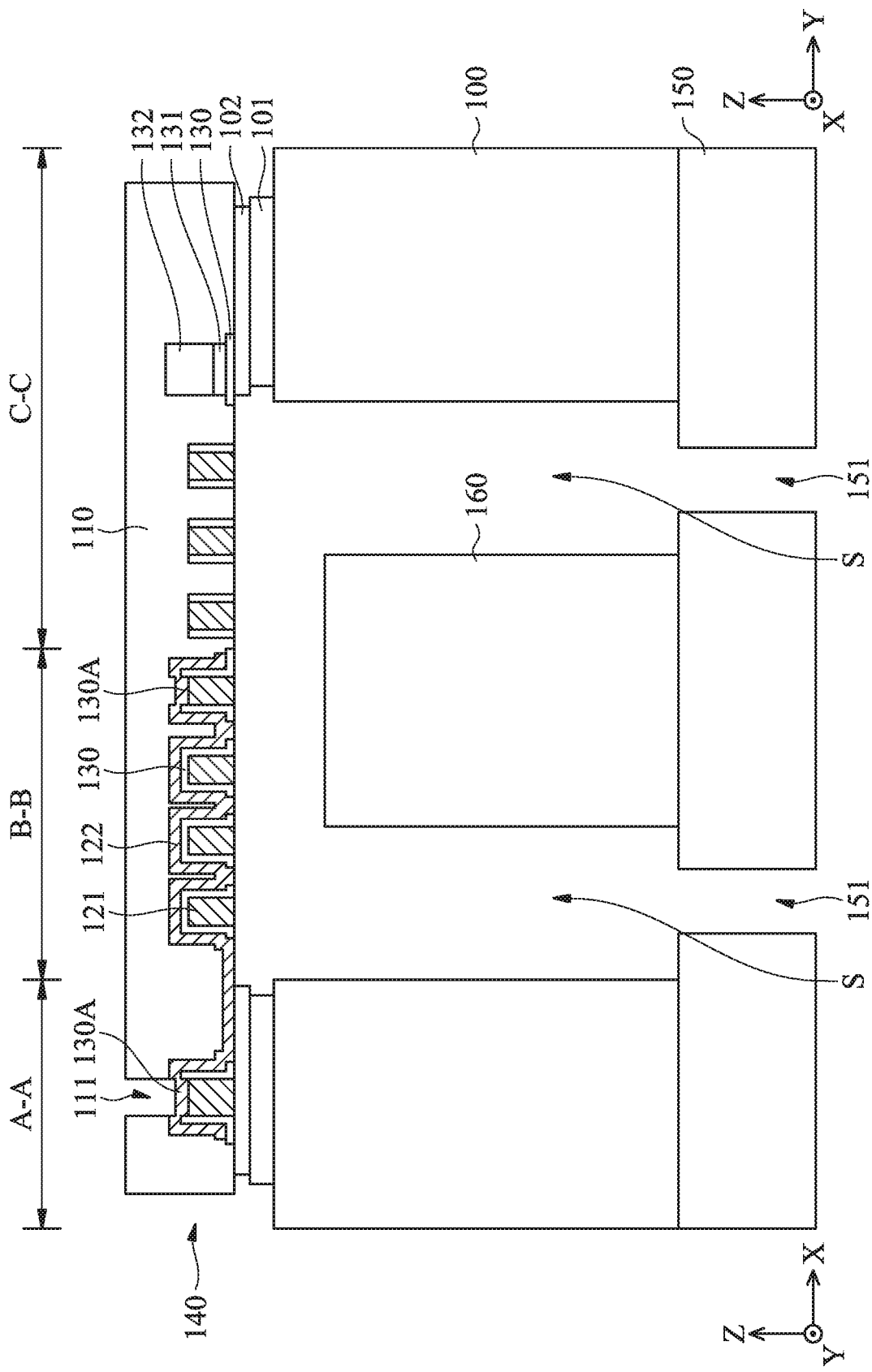

As shown in FIG. 3E, a circuit board 150 is, for example, a printed circuit board (PCB), and is bonded to the substrate 100. That is, the substrate 100 is located between the circuit board 150 and the insulating layer 101. The circuit board 150 has at least one vent hole 151, which allows the hollow chamber S to communicate with the external environment. A permanent magnetic element 160 is disposed on the circuit board 150 and in the hollow chamber S. It should be noted that the permanent magnetic element 160 and the soft magnetic element 132 are located on different horizontal planes (which are parallel to X-Y planes). The permanent magnetic element 160 is configured to cooperate with the multi-layered coil 120 for generating force in Z-axis, and the diaphragm 110 may oscillate relative to the substrate 100 based on the generated force. The soft magnetic element 132 may deflect the magnetic field generated by the permanent magnetic element 160. Therefore, the generated force may be enhanced, and frequency response of the diaphragm 110 may be higher.

Figure 4:
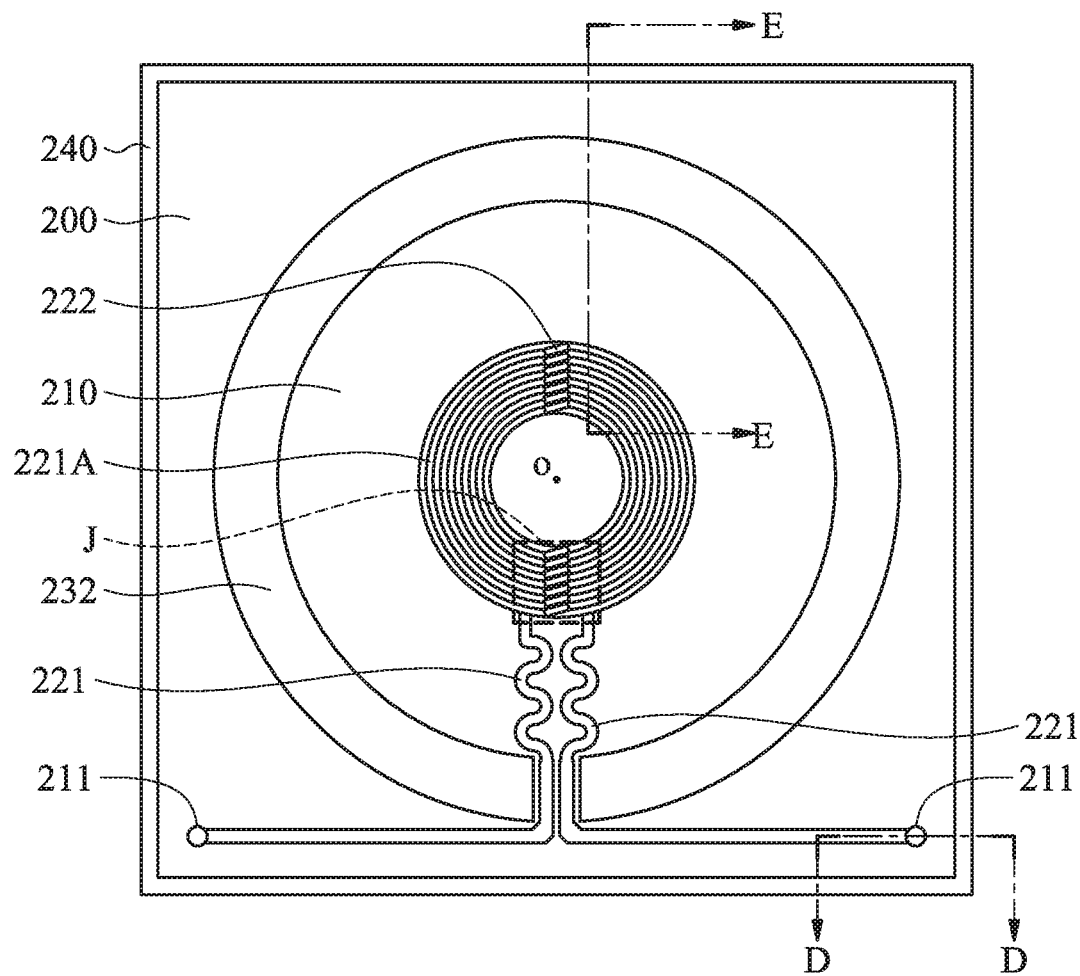
FIG. 4 is a schematic top view illustrating the movable embedded microstructure in accordance with some other embodiments of the present disclosure.

FIG. 4 is a schematic top view illustrating the movable embedded microstructure 20 in accordance with some other embodiments of the present disclosure. It should be appreciated that the movable embedded microstructure 20 may include the same or similar portions as the movable embedded microstructure 10 shown in FIG. 1, and those portions that are the same or similar will be labeled with similar numerals. For example, the movable embedded microstructure 20 includes a substrate 200, a diaphragm 210, a multi-layered coil 220, and a soft magnetic element 232. Similarly, it should be noted that in this embodiment the diaphragm 210 is illustrated to be transparent in order to show internal structures of the movable embedded microstructure 20.

Figure 5:
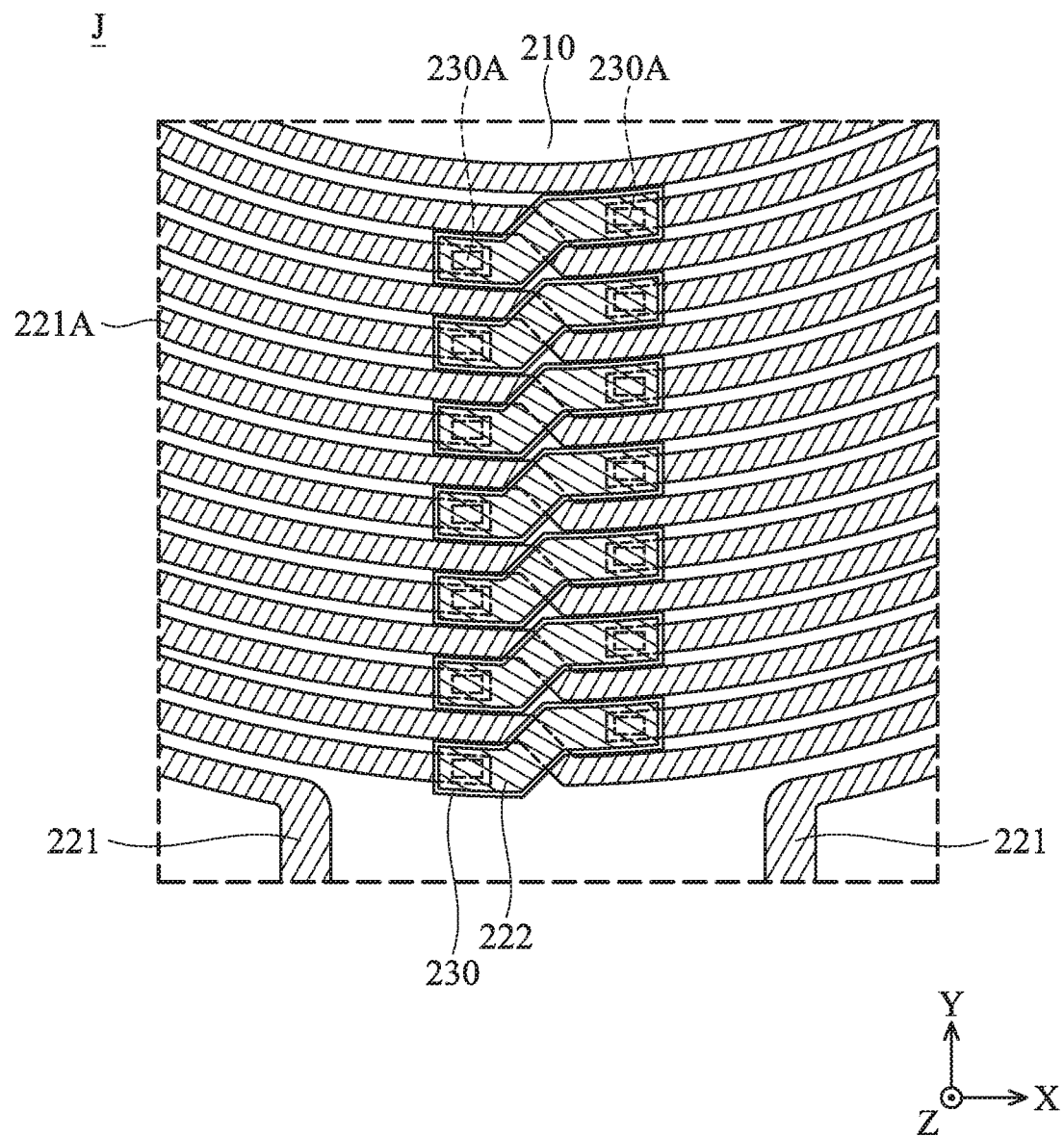
FIG. 5 is a schematic enlarged view illustrating a region J shown in FIG. 4.

In addition, the multi-layered coil 220 is embedded in the diaphragm 210, and includes a first layer 221 and a second layer 222, which are located on different planes which are parallel to the X-Y plane. The difference between the movable embedded microstructure 20 and the movable embedded microstructure 10 shown in FIG. 1 is that in the present embodiment, the first layer 221 includes a plurality of coaxial segments 221A disposed around the central axis O of the diaphragm 210, and the plurality of coaxial segments 221A are electrically connected by the second layer 222. It should be appreciated that the multi-layered coil 220 is schematically illustrated in FIG. 4, and the detailed structure of the multi-layered coil 220 (such as the coaxial segments 221A) is shown in FIG. 5. Furthermore, the second layer 222 is disposed symmetrically around the central axis O of the diaphragm 210.

FIG. 5 is a schematic enlarged view illustrating a region J shown in FIG. 4. As shown in FIG. 5, the second layer 222 connects the separated coaxial segments 221A of the first layer 221. A dielectric layer 230 is disposed between the first layer 221 and the second layer 222 in order to prevent from generating short circuit between the first layer 221 and the second layer 222. Openings 230A are formed in the dielectric layer 230, and the first layer 221 is electrically connected to the second layer 222 in the openings 230A.

Figure 6:
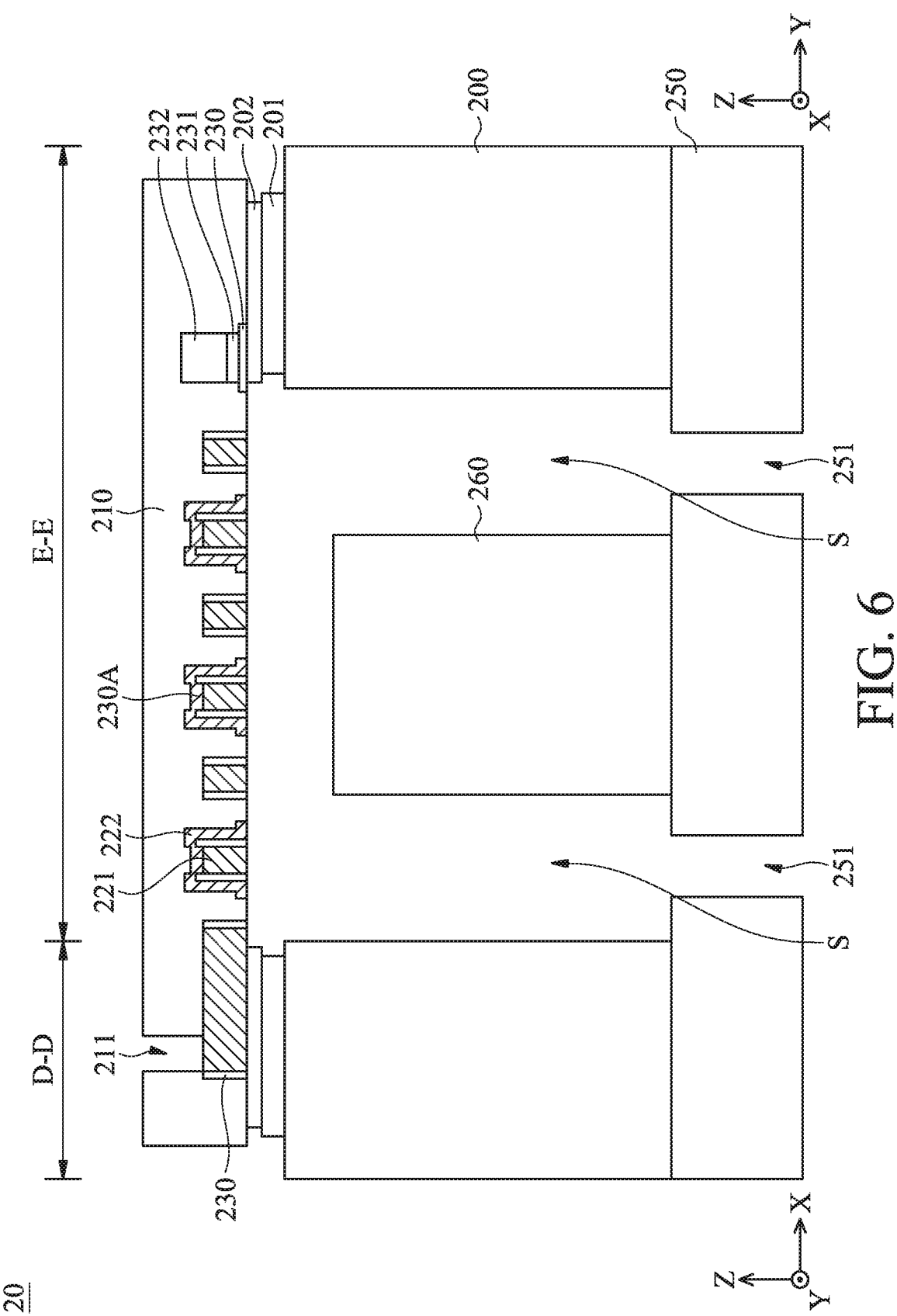
FIG. 6 is a schematic cross-sectional view illustrating lines D-D and E-E shown in FIG. 4.

FIG. 6 is a schematic cross-sectional view illustrating lines D-D and E-E shown in FIG. 4. It should be understood that FIG. 6 includes cross-sectional views along lines D-D and E-E shown in FIG. 4. Two sets of coordinate axes are provided in FIG. 6, wherein one set of coordinate axes in the left-hand side correspond the cross-sectional view along line D-D, and the other set of coordinate axes in the right-hand side correspond the cross-sectional view along line E-E.

The detailed structure of the movable embedded microstructure 20 is shown in FIG. 6. The manufacturing processes of the movable embedded microstructure 20 are substantially the same as the manufacturing processes of the movable embedded microstructure 10, and will not be described in detail again. As shown in FIG. 6, the second layer 222 distributes substantially evenly in the diaphragm 210. When the diaphragm 210 oscillates relative to the substrate 200, the distribution of the oscillating force may be more even. Therefore, the total harmonic distortion (THD) value of the movable embedded microstructure 20 may be reduced, and the lifetime of the movable embedded microstructure 20 may be longer.

As described above, some embodiments of the present disclosure provide a movable embedded microstructure with a multi-layered coil. The movable embedded microstructure is manufactured by micro electromechanical system (MEMS) technique. Therefore, the size of the movable embedded microstructure may be significantly reduced. In addition, by symmetrically arranging the second layer of the multi-layered coil, the total harmonic distortion (THD) value of the movable embedded microstructure may be reduced. Therefore, the performance of the movable embedded microstructure may be enhanced.

While the embodiments and the advantages of the present disclosure have been described above, it should be understood that those skilled in the art may make various changes, substitutions, and alterations to the present disclosure without departing from the spirit and scope of the present disclosure. In addition, the scope of the present disclosure is not limited to the processes, machines, manufacture, composition, devices, methods and steps in the specific embodiments described in the specification. Those skilled in the art may understand existing or developing processes, manufacture, compositions, devices, methods and steps from some embodiments of the present disclosure. As long as those may perform substantially the same function in the aforementioned embodiments and obtain substantially the same result, they may be used in accordance with some embodiments of the present disclosure. Therefore, the scope of the present disclosure includes the aforementioned processes, manufacture, composition, devices, methods, and steps. Furthermore, each of the appended claims constructs an individual embodiment, and the scope of the present disclosure also includes every combination of the appended claims and embodiments.

What is claimed is:

1. A movable embedded microstructure, comprising:
a substrate having a hollow chamber;
a diaphragm, disposed on the substrate, covering the hollow chamber;
a circuit board bonded to the substrate;
a permanent magnetic element disposed on the circuit board and in the hollow chamber;
a multi-layered coil embedded in the diaphragm;
an insulating layer formed between the substrate and the diaphragm; and
a seed layer and a soft magnetic element, wherein the seed layer is disposed between the insulating layer and the soft magnetic element.

2. The movable embedded microstructure as claimed in claim 1, wherein the seed layer and the soft magnetic element are embedded in the diaphragm.

3. The movable embedded microstructure as claimed in claim 1, wherein the soft magnetic element and the permanent magnetic element are located on different horizontal planes.

4. The movable embedded microstructure as claimed in claim 1, wherein the seed layer comprises titanium and/or copper.

5. The movable embedded microstructure as claimed in claim 1, wherein the soft magnetic element comprises nickel-iron alloy.

6. The movable embedded microstructure as claimed in claim 1, wherein the multi-layered coil comprises a first layer and a second layer, and the first layer and the second layer partially overlap.

7. The movable embedded microstructure as claimed in claim 6, further comprising a dielectric layer formed between the first layer and the second layer.

8. The movable embedded microstructure as claimed in claim 7, wherein the dielectric layer has vias, and the first layer is electrically connected to the second layer through the vias.

9. The movable embedded microstructure as claimed in claim 8, wherein some of the vias on the dielectric layer and an opening of the diaphragm overlap in a vertical direction.

10. The movable embedded microstructure as claimed in claim 6, wherein the first layer has a spiral structure disposed around a central axis of the diaphragm, and the second layer crosses the spiral structure.

11. The movable embedded microstructure as claimed in claim 10, wherein the first layer is electrically connected to the second layer in an opening of the diaphragm, and the first layer has an S-shaped structure connecting the spiral structure to the opening.

12. The movable embedded microstructure as claimed in claim 6, wherein the first layer comprises a plurality of coaxial segments disposed around a central axis of the diaphragm, and the plurality of coaxial segments are electrically connected by the second layer.

13. The movable embedded microstructure as claimed in claim 12, wherein the second layer is disposed symmetrically around the central axis of the diaphragm.

14. The movable embedded microstructure as claimed in claim 1, wherein the multi-layered coil comprises aluminum silicon alloy, aluminum, or copper.

15. The movable embedded microstructure as claimed in claim 1, wherein the diaphragm comprises a macromolecular material, and the Young's modulus of the macromolecular material is in a range of 1 MPa to 100 GPa.

16. The movable embedded microstructure as claimed in claim 1, wherein a groove is formed around the diaphragm.

17. The movable embedded microstructure as claimed in claim 1, wherein the circuit board has vent holes, and the vent holes allow the hollow chamber to communicate with the external environment.

18. A micro-speaker, comprising:
a substrate having a hollow chamber;
a diaphragm, disposed on the substrate, covering the hollow chamber;
a circuit board bonded to the substrate;
a permanent magnetic element disposed on the circuit board and in the hollow chamber;
a multi-layered coil embedded in the diaphragm; and
a soft magnetic element, disposed on the substrate, embedded in the diaphragm.

* * * * *